US010315250B2

(12) United States Patent
Nguyen et al.

(10) Patent No.: US 10,315,250 B2
(45) Date of Patent: Jun. 11, 2019

(54) FORMING FACSIMILE FORMATION CORE SAMPLES USING THREE-DIMENSIONAL PRINTING

(71) Applicant: Halliburton Energy Services, Inc., Houston, TX (US)

(72) Inventors: Philip D. Nguyen, Houston, TX (US); Nicholas H. Gardiner, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 409 days.

(21) Appl. No.: 15/114,242

(22) PCT Filed: Jun. 19, 2014

(86) PCT No.: PCT/US2014/043136
§ 371 (c)(1),
(2) Date: Jul. 26, 2016

(87) PCT Pub. No.: WO2015/195127
PCT Pub. Date: Dec. 23, 2015

(65) Prior Publication Data
US 2017/0008085 A1  Jan. 12, 2017

(51) Int. Cl.
| B22F 3/105 | (2006.01) |
| E21B 41/00 | (2006.01) |
| B33Y 10/00 | (2015.01) |
| B33Y 50/02 | (2015.01) |
| B23K 26/342 | (2014.01) |
| B22F 5/00 | (2006.01) |
| B23K 15/00 | (2006.01) |
| B28B 1/00 | (2006.01) |
| B29C 64/386 | (2017.01) |
| G06F 17/50 | (2006.01) |
| E21B 25/00 | (2006.01) |
| E21B 49/06 | (2006.01) |

(52) U.S. Cl.
CPC ............ *B22F 3/1055* (2013.01); *B22F 5/00* (2013.01); *B23K 15/0086* (2013.01); *B23K 26/342* (2015.10); *B28B 1/001* (2013.01); *B29C 64/386* (2017.08); *B33Y 10/00* (2014.12); *B33Y 50/02* (2014.12); *E21B 41/00* (2013.01); *B22F 2003/1057* (2013.01); *E21B 25/00* (2013.01); *E21B 49/06* (2013.01); *G06F 17/50* (2013.01)

(58) Field of Classification Search
CPC ................................................... B28B 1/001
See application file for complete search history.

(56) References Cited

U.S. PATENT DOCUMENTS

| 7,082,993 | B2 | 8/2006 | Ayoub et al. |
| 7,201,221 | B2 | 4/2007 | Tubel et al. |
| 7,291,002 | B2 | 11/2007 | Russell et al. |
| 7,569,273 | B2 | 8/2009 | Bredt et al. |
| 8,070,473 | B2 | 12/2011 | Kozlak |
| 8,096,354 | B2 | 1/2012 | Poitzsch et al. |
| 2003/0039389 | A1 | 2/2003 | Jones et al. |
| 2006/0058632 | A1 | 3/2006 | McBurnett et al. |
| 2009/0107724 | A1 | 4/2009 | Utter et al. |
| 2009/0166088 | A1 | 7/2009 | Jeffryes et al. |
| 2010/0324868 | A1 | 12/2010 | Russell et al. |
| 2011/0211036 | A1* | 9/2011 | Tran .................... H04N 5/23238 348/14.08 |
| 2012/0224755 | A1* | 9/2012 | Wu ......................... G06T 17/00 382/131 |
| 2013/0176312 | A1 | 7/2013 | Schouwenburg et al. |
| 2013/0180327 | A1 | 7/2013 | Frederick |
| 2014/0031967 | A1 | 1/2014 | Unger et al. |
| 2014/0076544 | A1* | 3/2014 | Lecerf ..................... E21B 41/00 166/250.01 |
| 2014/0379119 | A1* | 12/2014 | Sciacchitano ...... G05B 19/4099 700/182 |
| 2015/0355158 | A1* | 12/2015 | Lander ................... G01N 33/24 702/2 |
| 2017/0045088 | A1* | 2/2017 | Gluck ..................... F16C 41/00 |

FOREIGN PATENT DOCUMENTS

| WO | 2001073424 A1 | 10/2001 |
| WO | 2005097476 A2 | 10/2005 |
| WO | 2012073089 A1 | 6/2012 |
| WO | 2013043908 A1 | 3/2013 |
| WO | 2013093868 A1 | 6/2013 |

OTHER PUBLICATIONS

International Search Report and Written Opinion for PCT/US2014/043136 dated Jan. 30, 2015.

* cited by examiner

*Primary Examiner* — Joseph A Miller, Jr.
(74) *Attorney, Agent, or Firm* — McGuireWoods LLP

(57) ABSTRACT

Methods including providing an actual formation core sample; determining an internal anatomy of at least a portion of the actual formation core sample; determining a virtual 3D model of the external anatomy of the actual formation core sample in a computer readable format, wherein the virtual 3D model of the external anatomy of the actual formation core sample is represented by successive 2D cross-sectional layers; providing a 3D printer; transmitting the virtual 3D model of the external anatomy of the actual formation core sample to the 3D printer; and printing a facsimile core sample using the 3D printer, thereby replicating at least a portion of the external anatomy of the actual formation core sample.

17 Claims, No Drawings

FORMING FACSIMILE FORMATION CORE SAMPLES USING THREE-DIMENSIONAL PRINTING

BACKGROUND

The embodiments herein relate to methods of forming facsimile formation core samples using three-dimensional printing and, more particularly, to forming facsimile formation core samples that replicate either or both of the internal and external anatomy of a formation using three-dimensional printing.

Subterranean formation operations (e.g., stimulation operations, sand control operations, completion operations, etc.) often involve drilling a wellbore in a subterranean formation. The wellbore (e.g., vertical, deviated, and horizontal wellbores) is generally drilled using a drilling fluid pumped down a drill string and through a drill bit attached to the end of the drill string. The drilling fluid serves, among other things, to lubricate and cool the cutting surfaces of the drill bit, transport drill cuttings to the surface, control formation pressure, and maintain well stability.

In various oil and gas exploration operations, it is desirable to have available information about the composition and/or structure of the subterranean formation into which the wellbore is penetrated. Such information may be used to, among other things, determine the permeability of the formation, determine the porosity of the formation (i.e., the reservoir storage capacity), determine the compatibility of fluids used to perform subterranean formation operations, and the like. Such determinations may be essential to predicting the specific operational parameters for certain operations, estimating the productivity of the formation, approximating the lifetime of the formation, estimating the water content of the formation, and the like. Typically, in order to obtain such information, a downhole tool is employed that collects formation core samples. The downhole tool is generally a coring tool that hollows through the wall of the wellbore and into the formation for collecting a core sample, which is thereafter removed to the surface. Such formation core samples are typically obtained during or directly after drilling operations. Accordingly, they are generally limited to full-diameter core samples that are taken during drilling and are about the diameter of the drill bit, or sidewall core samples that are taken after drilling and are less than the full diameter of the drill bit.

In the case of full-diameter core samples, the drill string must be removed from the wellbore at some point during drilling operations in order to permit the coring tool to be penetrated therein. After the full-diameter core sample is removed, the coring tool must then be removed from the wellbore and drilling operations again commenced. In the case of sidewall core samples, the coring tool must be introduced into the wellbore after the full wellbore has been drilled and the drill string removed. In both cases, the amount of formation core samples is limited in terms of sample availability, time, and expense. Accordingly, only a relatively small subset of formation core samples is gathered for any particular wellbore in a subterranean formation. The relatively small subset of formation core samples translates into a reduced number of analyses that can be performed on each sample, particularly when testing is or may be destructive. As such, a full picture of the properties of the subterranean formation penetrated by a particular wellbore may not be possible.

DETAILED DESCRIPTION

The embodiments herein relate to methods of forming facsimile formation core samples using three-dimensional printing and, more particularly, to forming facsimile formation core samples that replicate either or both of the internal and external anatomy of a formation using three-dimensional printing.

Three dimensional (also referred to herein as "3D") printing is a process of making a 3D solid object from a virtual 3D model. The process of 3D printing utilizes an additive process, in which successive two-dimensional (also referred to herein as "2D") cross-sectional layers are laid down in different shapes and using different "ink" compositions under computer control. A 3D solid object may be printed based on a virtual 3D representation of the object from computer files, such as computer-aided design (or "CAD") files. Such virtual 3D representations (or models) may be actual size or to scale and thereafter printed in 3D.

The 3D facsimile formation core samples (also referred to herein as "facsimile core samples") described in the present disclosure may, in some embodiments, represent either or both the internal anatomy and the external anatomy of an actual formation core, or any portion thereof. As used herein, the term "internal anatomy" refers to the chemical composition of an actual formation core. That is, the facsimile core sample may be 3D printed using the same chemistry (e.g., a carbonate or silica) as that found in the actual formation core. In some embodiments, only a portion of the chemistry of the actual formation core may be used to form the facsimile core sample, for example, if only a particular chemistry (e.g., a clay) was of interest for a particular test. Accordingly, in some embodiments, the entire internal anatomy of an actual core formation may be used to print an exact facsimile core sample replica. In other embodiments, only a portion of the internal anatomy of the actual core formation may be used to hone in on a particular analysis of the sample, to save on costs without sacrificing desired testing, to accommodate the requirements of the 3D printer or printing type, and the like. As used herein, the term "external anatomy" refers to the physical structure of an actual formation core sample. Examples of an external anatomy of an actual core sample may include the core sample's porosity, relief or contour characteristics, internal channels or fissures, granularity, and the like; the term is not limited to the particular location of any such characteristic with reference to the core sample.

The internal and external anatomy of the actual formation can be emulated based on the actual internal and external anatomy of an actual formation core sample, either full-diameter, sidewall, or any other configuration, taken from a subterranean formation (e.g., during or after drilling a wellbore therein). Once the internal and/or external anatomy of the actual formation is mimicked to form a 3D facsimile core sample, various physical tests may be performed thereon at a relatively reduced cost, as opposed to having to conduct such physical tests on a limited supply of actual formation core samples. Moreover, the supply of 3D facsimile core samples is unlimited or near unlimited depending on the availability of required "inks" or other components necessary to 3D print the facsimile core sample. Accordingly, alternative testing can be performed without limitation, such as to optimize certain fluids, stimulation parameters, and the like, that are used to perform certain subterranean formation operations.

One or more illustrative embodiments disclosed herein are presented below. Not all features of an actual implementation are described or shown in this application for the sake of clarity. It is understood that in the development of an actual embodiment incorporating the embodiments disclosed herein, numerous implementation-specific decisions must be made to achieve the developer's goals, such as compliance with system-related, lithology-related, business-related, government-related, and other constraints, which vary by implementation and from time to time. While a developer's efforts might be complex and time-consuming, such efforts would be, nevertheless, a routine undertaking for those of ordinary skill the art having benefit of this disclosure.

It should be noted that when "about" is provided herein at the beginning of a numerical list, the term modifies each number of the numerical list. In some numerical listings of ranges, some lower limits listed may be greater than some upper limits listed. One skilled in the art will recognize that the selected subset will require the selection of an upper limit in excess of the selected lower limit. Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the exemplary embodiments described herein. At the very least, and not as an attempt to limit the application of the doctrine of equivalents to the scope of the claim, each numerical parameter should at least be construed in light of the number of reported significant digits and by applying ordinary rounding techniques.

While compositions and methods are described herein in terms of "comprising" various components or steps, the compositions and methods can also "consist essentially of" or "consist of" the various components and steps. When "comprising" is used in a claim, it is open-ended.

In some embodiments, the present disclosure provides a method comprising providing an actual formation core sample from an actual subterranean formation of interest. The actual formation core sample may be of any size or shape, and such may depend on the availability of downhole tools in the field or the stage of drilling of a wellbore in the formation, for example. In some embodiments, the actual formation core sample may be substantially (that is, largely, but not necessarily wholly) cylindrical and may be either the full-diameter of the drill bit used to drill a wellbore in the formation or of a smaller diameter (e.g., in some cases less than about 2.54 cm or 1 inch). After obtaining the actual formation core sample, the chemical elements composing at least a portion thereof is determined. Such chemical elements may be determined by at least one method including, but not limited to, x-ray diffraction, near-infrared spectroscopy, energy-dispersive x-ray spectroscopy, and any combination thereof. X-ray diffraction involves the identification of the atomic and molecular structure of an object (e.g., a crystal) by measuring the angles and intensities of diffracted x-ray beams therefrom to produce a 3D image of electron density and the mean positions of atoms therein. Near-infrared spectroscopy ("NIRS") is a spectroscopic method that uses the near-infrared region of the electromagnetic to extract desired chemical information and produce a 3D image, if desired. In some embodiments, multivariate calibration techniques (e.g., principal component analysis, partial least squares, and the like) may be employed to extract chemical information using NIRS and/or optical coherence tomography techniques may be used to create a desired 3D image. Energy-dispersive x-ray spectroscopy relies on the interaction of x-ray excitation with an object to perform elemental analysis or chemical characterization based on each element having a unique anatomic structure corresponding to peaks on its x-ray spectrum.

Next, a virtual 3D model of the external anatomy of the actual formation core sample is determined in a computer readable format by at least one method including, but not limited to, x-ray diffraction, near-infrared spectroscopy, scanning electron microscopy, which produces 3D images of objects by scanning them with a focused beam of electrons, x-ray computed tomography scan, which uses computer-processed x-rays to produce tomographic 3D images of an object, and any combination thereof. The virtual 3D model of the external anatomy of the actual formation core sample is represented by successive 2D cross-sectional layers. Any available computer readable format may be utilized, such as a computer modeling software, which may or may not be geared toward the oil and gas industry. Additionally, the virtual 3D model may be input into a computer modeling software as a whole, and the computer modeling software may thereafter form the successive 2D cross-sectional layers, or the method selected may itself provide the successive 2D cross-sectional layers to the computer modeling software. In some embodiments, the virtual 3D model may be manipulated to compensate for damage or other anomalies in the actual core sample, such as those caused during the coring process in which portions or areas of the core have been removed (e.g., holes or gaps due to the coring process). Such manipulation may be performed using the computer modeling software, for example, to better simulate the state of the core as it existed in place in the subterranean formation.

The virtual 3D model of the external anatomy of the actual formation core sample is then transmitted to a 3D printer (e.g., a commercially available 3D printer compatible with the computer readable format/computer modeling software). In some embodiments, the entire virtual 3D model of the external anatomy of the formation core sample is transmitted and, in other embodiments, a representative portion may be transmitted. The 3D printer then forms a facsimile formation core sample by printing the successive 2D cross-sectional layers atop one another to form a final 3D facsimile core sample that replicates the chosen anatomy (internal and/or external) or portion of anatomy of the actual formation core sample. The method in which the 3D printer prints the facsimile core sample is not restrictive, and, in some embodiments, may be based on the particular anatomy characteristics of the actual formation core sample to be printed or the type of testing to be performed on the facsimile core sample (e.g., based on durability, and the like). In some embodiments, the method of printing the facsimile formation core sample using the 3D printer may include, but is not limited to, fused deposition modeling, electron beam freeform fabrication, direct metal laser sintering, electron-beam melting, selective laser melting, selective heat sintering, selective laser sintering, and maskless mesoscale materials deposition.

The 3D printer may utilize any "ink" to print (also referred to herein as "printing material") the facsimile core sample that is compatible with the 3D printer and, if desired, that is identical or mimics a portion or all of the internal or external anatomy of the actual formation core sample being replicated. That is, in some embodiments, a material that is similar in chemical composition or other manner to a particular internal anatomy aspect of the actual formation core sample may be utilized even if it is not identical in chemical composition. In such instances, the alternative material may be selected such that it is expected to react or behave in a similar or identical way to the material of interest in the actual formation core sample. Such materials may, thus, include materials naturally occurring in subterranean formations, such as hydrocarbon-containing subterranean formations, that are capable of being used with the 3D printer and capable of binding together (alone or in the presence of a binder) to form a cohesive facsimile core sample. In other embodiments, such materials may not be selected based on their similarity or identicalness.

Such suitable printing materials for forming the facsimile core samples may include, but are not limited to, a thermoplastic, a eutectic metal, a rubber, a clay, a ceramic, a metal alloy, an elemental metal, a metal clay, a conductive plastic composite, a carbonate, silicon, silicon dioxide, aluminum, magnesium oxide, iron, calcium, and any combination thereof. Other additives may also be included that are not immediately reactive or otherwise used to form the structural integrity of the facsimile core sample (i.e., that are inert) such as, for example, materials to simulate texture (e.g., sand, gravel, particulates, or other grit-like material, silica, a salt, a hydrocarbon (e.g., tar, asphaltene, liquid hydrocarbons, hydrocarbon complexes, and the like), and the like). Generally, the amount and ratio of one or more printing materials selected, and any additives, will be dependent upon the internal and external anatomy of the actual formation core sample, which may vary widely depending on the type of subterranean formation, the composition of the subterranean formation (e.g., high levels of salts), and the like.

In some embodiments, during the process of 3D printing the facsimile core sample, one or more sensors may be manually placed within or upon the facsimile core sample. For example, a sensor may be placed in a fissure or fracture in the facsimile core sample, on the outside of the facsimile core sample, sandwiched between two layers of the printing material in the facsimile core sample, situated centrally within the facsimile core sample, and the like. Generally, the sensor will not have any or very little impact on the internal or external anatomy of the facsimile core sample as it is replicating the actual formation core sample (e.g., the sensor may be relatively small and chemically inert). In other embodiments, the sensor may be placed upon or otherwise adhered to the facsimile core sample after 3D printing is complete. The type, location, and number of sensors included within or upon a particular facsimile core sample may depend on the type of sample, the type of testing to be performed, and the like.

In other embodiments, one or more sensors may be 3D printed within or upon the facsimile core sample simultaneously with 3D printing the facsimile core sample. In such embodiments, the present disclosure provides a method of determining the internal anatomy and virtual 3D model of the external anatomy in a computer readable format of at least a portion of an actual formation core sample as described therein. Successive 2D cross-sectional layers represent the virtual 3D model of the external anatomy of the actual formation core sample. Thereafter, the virtual 3D model of the external anatomy of the actual formation core sample is manipulated virtually to include at least one virtual 3D sensor model, thereby forming a virtual 3D model of the external anatomy of the actual formation core sample comprising at least one sensor. That is, the computer readable format of the virtual 3D model of the external anatomy is manipulated, such as with a computer modeling software, such that one or more sensors is included therein to be printed using the 3D printer, thereby forming a facsimile core sample comprising one or more 3D printed sensors. In some preferred embodiments, the one or more sensors are included within, on, or otherwise in contact with the facsimile core sample without interfering substantially with the external anatomy of the facsimile core sample.

In yet other embodiments, a combination of 3D printed sensors and manually placed sensors may be included with the facsimile core sample. For example, certain sensors may be readily available, less amendable to 3D printing, have a shortage of printing material available, and the like, and may be, thus, manually placed. In other instances, certain sensors may be particularly amendable to printing, have printing material readily available, have a relatively simple design, and the like, and may be, thus, 3D printed with the facsimile core sample.

In some embodiments, the manually placed and/or 3D printed sensor(s) may include, but not be limited to, a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof. The 3D printed sensors may be printed into various configurations, such as, for example, fibers (e.g., optical fibers), sensing grids (e.g., Bragg gratings), antenna, transmitters, and the like. The manually placed sensor(s) may take similar or identical forms. As such, the sensor(s) may operate during the performance of testing on the facsimile core samples such that meaningful information in the form of an electromagnetic signal and/or an acoustic signal, for example, is transmitted from the sensors to a receiver, which may be amplified by the signals if necessary, and then processed into a user readable medium (e.g., into an output on a computer screen). The sensors may be, thus, capable of sensing a stimulant in the facsimile core formation or other environment in which they are subjected, depending on the type of testing being performed (e.g., flow rate, resistance, pressure, and the like).

In some embodiments, the 3D printer prints the facsimile core sample using a first printing material and any 3D printed sensor is printed using a second printing material. In other cases, the facsimile core sample and the 3D printed sensor(s) may be printed using the same material, depending on the particular type of sensor and testing expected with the facsimile core sample, for example. The printing material for forming the facsimile core sample may include those printing materials previously mentioned including, but not limited to, a thermoplastic, a eutectic metal, a rubber, a clay, a ceramic, a metal alloy, an elemental metal, a metal clay, a conductive plastic composite, a carbonate, silicon, silicon dioxide, aluminum, magnesium oxide, iron, calcium, and any combination thereof. In some embodiments the printing material selected for forming one or more portions of the facsimile core sample may be selected to mimic at least a portion of the internal anatomy of the actual formation core sample. In some embodiments, an inert additive may further be included.

The printing material for forming the one or more sensors forming part of the facsimile core sample may be a material suitable for use in achieving one or more of the sensing functions described above. Such materials may include, but are not limited to, an optical material, a glass material, a plastic material, a conductive plastic composite material, a carbon black material, a copper material, and any combination thereof. In addition to the printed sensors, one or more of a resistor, inductor, capacitor, filter, micro-battery, and the like may also be included in the facsimile core samples described herein by 3D printing to facilitate testing of the facsimile core samples.

As discussed, the facsimile core samples can be used to perform testing to determine the effects of certain fluids, operations, and the like on the actual subterranean formation during subterranean formation operations (e.g., stimulation operations, workover operations, acidizing operations, and the like). Such testing may include, but is not limited to, flow rate analysis, fluid compatibility analysis, permeability regain analysis, leakoff analysis, damage removal analysis, acidizing analysis, sanding tendency analysis, perforation analysis, erosion analysis, consolidation analysis, diversion analysis, conformance analysis, and any combination thereof. The one or more sensors that may be included in the facsimile core samples may thus sense, or detect, the output of these tests and emit a signal that equates to the output. For example, the sensor for an acidizing analysis may detect the presence of an acid, the amount of acid spent, or remaining after acidizing is performed, the sensor for fluid compatibility analysis may detect whether formation permeability is reduced during treatment with particular fluids, and the like. The pressure sensor may be used to detect the pressure at a certain location within the core sample while fluids are being injected therethrough.

Embodiments disclosed herein include:

Embodiment A: method comprising: providing an actual formation core sample; determining an internal anatomy of at least a portion of the actual formation core sample by at least one method selected from the group consisting of x-ray diffraction, near-infrared spectroscopy, energy-dispersive x-ray spectroscopy, and any combination thereof; determining a virtual 3D model of the external anatomy of the actual formation core sample in a computer readable format by at least one method selected from the group consisting of x-ray diffraction, near-infrared spectroscopy, scanning electron microscopy, energy-dispersive x-ray spectroscopy, x-ray computed tomography scan, and any combination thereof, wherein the virtual 3D model of the external anatomy of the actual formation core sample is represented by successive 2D cross-sectional layers; providing a 3D printer; transmitting the virtual 3D model of the external anatomy of the actual formation core sample to the 3D printer; and printing a facsimile core sample using the 3D printer, thereby replicating at least a portion of the external anatomy of the actual formation core sample.

Embodiment A may have one or more of the following additional elements in any combination:

Element A1: Wherein the actual formation core sample comprises damage, and further comprising after the step of: determining the virtual 3D model of the external anatomy of the actual formation core sample in a computer readable format, manipulating a portion of the virtual 3D model of the external anatomy of the actual formation core sample to remove at least a portion of the damage.

Element A2: Wherein the 3D printer prints the facsimile formation core sample using at least one method selected from the group consisting of fused deposition modeling, electron beam freeform fabrication, direct metal laser sintering, electron-beam melting, selective laser melting, selective heat sintering, selective laser sintering, and maskless mesoscale materials deposition.

Element A3: Wherein the 3D printer prints the facsimile formation core sample using a printing material selected from the group consisting of a thermoplastic, a eutectic metal, a rubber, a clay, a ceramic, a metal alloy, an elemental metal, a conductive plastic composite, a carbonate, silicon, silicon dioxide, aluminum, magnesium oxide, iron, calcium, and any combination thereof.

Element A4: Wherein the printing material is selected to mimic at least a portion of the internal anatomy of the actual formation core sample.

Element A5: Further comprising manually placing at least one sensor within or onto the facsimile core sample during printing.

Element A6: Wherein the at least one sensor is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

Element A7: Wherein the at least one sensor emits an output signal in the form of at least one of an electromagnetic signal and an acoustic signal.

Element A8: Wherein the facsimile core sample is used to perform flow rate analysis, fluid compatibility analysis, permeability regain analysis, leakoff analysis, damage removal analysis, acidizing analysis, sanding tendency analysis, perforation analysis, erosion analysis, consolidation analysis, diversion analysis, conformance analysis, and any combination thereof.

By way of non-limiting example, exemplary combinations applicable to A include: A with A1 and A8; A with A2, A3, and A4; A with A3 and A6; A with A1, A2, A5, and A7; A with A8.

Embodiment B: A method comprising: providing an actual formation core sample; determining an internal anatomy of at least a portion of the actual formation core sample by at least one method selected from the group consisting of x-ray diffraction, near-infrared spectroscopy, energy-dispersive x-ray spectroscopy, and any combination thereof; determining a virtual 3D model of an external anatomy of the actual formation core sample in a computer readable format by at least one method selected from the group consisting of x-ray diffraction, near-infrared spectroscopy, scanning electron microscopy, energy-dispersive x-ray spectroscopy, x-ray computed tomography scan, and any combination thereof, wherein the virtual 3D model of the external anatomy of the actual formation core sample is represented by successive 2D cross-sectional layers; manipulating a portion of the virtual 3D model of the external anatomy of the actual formation core sample to include at least one virtual 3D sensor model, thereby forming a virtual 3D model of the external anatomy of the actual formation core sample comprising at least one sensor; providing a 3D printer; transmitting the virtual 3D model of the external anatomy of the actual formation core sample comprising at least one sensor to the 3D printer; and printing a facsimile core sample comprising at least one sensor using the 3D printer, thereby replicating the external anatomy of the actual formation core sample and the at least one printed sensor.

Embodiment B may have one or more of the following additional elements in any combination:

Element B1: Wherein the actual formation core sample comprises damage, and further comprising after the step of: determining the virtual 3D model of the external anatomy of the actual formation core sample in a computer readable format, manipulating a portion of the virtual 3D model of the external anatomy of the actual formation core sample to remove at least a portion of the damage.

Element B2: Wherein the 3D printer prints the facsimile core sample comprising the at least one printed sensor using at least one method selected from the group consisting of fused deposition modeling, electron beam freeform fabrication, direct metal laser sintering, electron-beam melting, selective laser melting, selective heat sintering, selective laser sintering, maskless mesoscale materials deposition.

Element B3: Wherein the 3D printer prints the facsimile core sample using a first printing material and the at least one printed sensor using a second printing material.

Element B4: Wherein the first printing material is selected from the group consisting of a thermoplastic, a eutectic metal, a rubber, a clay, a ceramic, a metal alloy, an elemental metal, a metal clay, a conductive plastic composite, a carbonate, silicon, silicon dioxide, aluminum, magnesium oxide, iron, calcium, an any combination thereof.

Element B5: Wherein the first printing material is selected to mimic at least a portion of the internal anatomy of the actual formation core sample.

Element B6: Wherein the second printing material is selected from the group consisting of an optical material, a glass material, a plastic material, a conductive plastic composite material, a carbon black material, a copper material, and any combination thereof.

Element B7: Wherein the at least one printed sensor is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

Element B8: Further comprising manually placing at least one sensor within or onto the replica of the formation core sample comprising at least one printed sensor during printing.

Element B9: Wherein the at least one sensor manually placed is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

Element B10: Wherein the replica of the formation core sample is used to perform flow rate analysis, fluid compatibility analysis, permeability regain analysis, leakoff analysis, damage removal analysis, acidizing analysis, sanding tendency analysis, perforation analysis, erosion analysis, consolidation analysis, diversion analysis, conformance analysis, and any combination thereof.

By way of non-limiting example, exemplary combinations applicable to A include: B with B1 and B4; B with B1, B8, and B9; B with B3 and B6; B with B3, B5, and B6; B with B9 and B10.

Therefore, the embodiments disclosed herein are well adapted to attain the ends and advantages mentioned as well as those that are inherent therein. The particular embodiments disclosed above are illustrative only, as they may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A method comprising:
providing an actual formation core sample;
determining an internal anatomy of at least a portion of the actual formation core sample by at least one method selected from the group consisting of x-ray diffraction, near-infrared spectroscopy, energy-dispersive x-ray spectroscopy, and any combination thereof;
selecting an at least one printing material to mimic at least a portion of the internal anatomy of the actual formation core sample;
producing a virtual 3D model of the external anatomy of the actual formation core sample in a computer readable format by at least one method selected from the group consisting of x-ray diffraction, near-infrared spectroscopy, scanning electron microscopy, energy-dispersive x-ray spectroscopy, x-ray computed tomography scan, and any combination thereof,
wherein the virtual 3D model of the external anatomy of the actual formation core sample is represented by successive 2D cross-sectional layers;
providing a 3D printer;
transmitting the virtual 3D model of the external anatomy of the actual formation core sample to the 3D printer;
printing a facsimile core sample using the 3D printer, thereby replicating at least a portion of the external anatomy of the actual formation core sample; and
manually placing at least one sensor within or onto the facsimile core sample during printing.

2. The method of claim 1, wherein the actual formation core sample comprises damage, and further comprising manipulating a portion of the virtual 3D model of the external anatomy of the actual formation core sample by way of a computer modeling software that simulates the actual formation core sample as it was in the subterranean formation, thereby removing at least a portion of the damage in the virtual 3D model of the external anatomy of the actual core sample such that the printed facsimile core is based at least in part on the manipulated virtual 3D model.

3. The method of claim 1, wherein the 3D printer prints the facsimile formation core sample using at least one method selected from the group consisting of fused deposition modeling, electron beam freeform fabrication, direct metal laser sintering, electron-beam melting, selective laser melting, selective heat sintering, selective laser sintering, and maskless mesoscale materials deposition.

4. The method of claim 1, wherein the 3D printer prints the facsimile formation core sample using the printing material selected from the group consisting of a thermoplastic, a eutectic metal, a rubber, a clay, a ceramic, a metal alloy, an elemental metal, a metal clay, a conductive plastic composite, a carbonate, silicon, silicon dioxide, aluminum, magnesium oxide, iron, calcium, and any combination thereof.

5. The method of claim 1, wherein the at least one sensor is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

6. The method of claim 1, wherein the at least one sensor emits an output signal in the form of at least one of an electromagnetic signal and an acoustic signal.

7. The method of claim 1, wherein a fluid is tested with the facsimile core sample to determine at least a portion of one analyses selected from the group consisting of flow rate analysis, fluid compatibility analysis, permeability regain analysis, leakoff analysis, damage removal analysis, acidizing analysis, sanding tendency analysis, perforation analysis, erosion analysis, consolidation analysis, diversion analysis, conformance analysis, and any combination thereof, thereby determining the effects of the fluid therein.

8. A method comprising:
providing an actual formation core sample;
determining an internal anatomy of at least a portion of the actual formation core sample by at least one method selected from the group consisting of x-ray diffraction, near-infrared spectroscopy, energy-dispersive x-ray spectroscopy, and any combination thereof;
selecting at least a first printing material to mimic at least a portion of the internal anatomy of the actual formation core sample;
producing a virtual 3D model of an external anatomy of the actual formation core sample in a computer readable format by at least one method selected from the group consisting of x-ray diffraction, near-infrared spectroscopy, scanning electron microscopy, energy-dispersive x-ray spectroscopy, x-ray computed tomography scan, and any combination thereof,
wherein the virtual 3D model of the external anatomy of the actual formation core sample is represented by successive 2D cross-sectional layers;
manipulating a portion of the virtual 3D model of the external anatomy of the actual formation core sample to include at least one virtual 3D sensor model, thereby forming a virtual 3D model of the external anatomy of the actual formation core sample comprising at least one sensor;
providing a 3D printer;
transmitting the virtual 3D model of the external anatomy of the actual formation core sample comprising at least one sensor to the 3D printer; and
printing a facsimile core sample comprising at least one sensor using the 3D printer, thereby replicating the external anatomy of the actual formation core sample and the at least one printed sensor.

9. The method of claim 8, wherein the actual formation core sample comprises damage, and further comprising manipulating a portion of the virtual 3D model of the external anatomy of the actual formation core sample by way of a computer modeling software that simulates the actual formation core sample as it was in the subterranean formation, thereby removing at least a portion of the damage in the virtual 3D model of the external anatomy of the actual core sample such that the printed facsimile core is based at least in part on the manipulated virtual 3D model.

10. The method of claim 8, wherein the 3D printer prints the facsimile core sample comprising the at least one printed sensor using at least one method selected from the group consisting of fused deposition modeling, electron beam freeform fabrication, direct metal laser sintering, electron-beam melting, selective laser melting, selective heat sintering, selective laser sintering, maskless mesoscale materials deposition.

11. The method of claim 8, wherein the 3D printer prints the facsimile core sample using the first printing material and the at least one printed sensor using a second printing material.

12. The method of claim 11, wherein the first printing material is selected from the group consisting of a thermoplastic, a eutectic metal, a rubber, a clay, a ceramic, a metal alloy, an elemental metal, a metal clay, a conductive plastic composite, a carbonate, silicon, silicon dioxide, aluminum, magnesium oxide, iron, calcium, an any combination thereof.

13. The method of claim 11, wherein the second printing material is selected from the group consisting of an optical material, a glass material, a plastic material, a conductive plastic composite material, a carbon black material, a copper material, and any combination thereof.

14. The method of claim 8, wherein the at least one printed sensor is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

15. The method of claim 8, further comprising manually placing at least one sensor within or onto the replica of the formation core sample comprising at least one printed sensor during printing.

16. The method of claim 15, wherein the at least one sensor manually placed is selected from the group consisting of a density sensor, a capacity sensor, a viscosity sensor, a resistivity sensor, an optical sensor, a temperature sensor, a flow rate sensor, a scale sensor, a strain sensor, a pressure sensor, a sound sensor, a flux sensor, a piezoresistive sensor, a capacitance sensor, and any combination thereof.

17. The method of claim 8, wherein a fluid is tested with the facsimile core sample to determine at least a portion of one analyses selected from the group consisting of flow rate analysis, fluid compatibility analysis, permeability regain analysis, leakoff analysis, damage removal analysis, acidizing analysis, sanding tendency analysis, perforation analysis, erosion analysis, consolidation analysis, diversion analysis, conformance analysis, and any combination thereof, thereby determining the effects of the fluid therein.

* * * * *